US006507658B1

(12) United States Patent
Abel et al.

(10) Patent No.: US 6,507,658 B1

(45) Date of Patent: Jan. 14, 2003

(54) SURROUND SOUND PANNER

(75) Inventors: Jonathan S. Abel, Palo Alto, CA (US); William Putnam, Santa Cruz, CA (US)

(73) Assignee: Kind of Loud Technologies, LLC, Santa Cruz, CA (US)

( * ) Notice: Subject to any disclaimer, the term of this patent is extended or adjusted under 35 U.S.C. 154(b) by 0 days.

(21) Appl. No.: 09/492,115

(22) Filed: Jan. 27, 2000

Related U.S. Application Data

(60) Provisional application No. 60/117,496, filed on Jan. 27, 1999.

(51) Int. Cl.[7] .............................. H04R 5/00; H03G 3/00

(52) U.S. Cl. .............................. 381/17; 381/18; 381/63

(58) Field of Search .............................. 381/17, 18, 63, 381/309, 310, 74, 26

(56) References Cited

U.S. PATENT DOCUMENTS 5,042,070 A * 8/1991 Linna et al. .................. 381/59
5,459,790 A * 10/1995 Scofield et al. ............... 381/18
5,633,993 A * 5/1997 Redmman et al. ............ 381/61
5,812,674 A * 9/1998 Jot et al. ....................... 381/17
5,862,228 A * 1/1999 Davis ........................... 381/17
6,072,878 A * 6/2000 Moorer ......................... 381/17
6,091,894 A * 7/2000 Fujita et al. .................. 381/17
6,363,155 B1 * 3/2002 Horbach ...................... 381/61

* cited by examiner

*Primary Examiner*—Forester W. Isen
*Assistant Examiner*—Laura A Grier
(74) *Attorney, Agent, or Firm*—Pillsbury Winthrop LLP

(57) ABSTRACT

A method and apparatus implements a novel surround sound panning paradigm. Rather than controlling the x-y position of a perceived sound source within a linear grid, the perceived sound is characterized by specifying perceived arrival energy as a function of direction of arrival. In one embodiment, perceived sound source azimuth and width (or spatial extent) are specified, which parameters are used in a novel panning law to control each output channel. In a preferred implementation, the panning control is provided in a Plug-In application for a conventional DAW environment such as Pro Tools, which application includes an interface that provides precise control over the direction and spatial extent of audio.

15 Claims, 13 Drawing Sheets

SURROUND SOUND PANNER

Priority is claimed based on Provisional Application No. 60/117,496 filed Jan. 27, 1999.

BACKGROUND OF THE INVENTION

1. Field of the Invention

The present invention pertains to audio signal processing, and more specifically, to a method and apparatus for surround sound panning.

2. Description of the Related Art

Surround sound audio (wherein, for example, sound is generated for one or more listeners 105, 106 using multiple speakers i 100–104, each respectively positioned at angle $\phi(i)$ from listener 105 (positioned at a "sweet spot"), as illustrated in FIG. 1) is growing rapidly due to the proliferation of home theaters, digital television, surround sound music, and computer games. The roots of surround sound audio are in the motion picture industry. It has been employed by movie soundtracks to locate sounds, creating a captivating environment for the theater patron. Typical theaters have three speakers in the front which provide stereo along with a center channel for dialog, and two speakers in the rear for special effects and ambient sounds. In recent years this technology has made its way to the home, fueling a rapidly growing surround sound home theater market. Dolby ProLogic has been used to enhance television shows by creating a surround sound effect. Technologies such as DVD are bringing advanced multi-channel digital audio into the home, providing an audio experience rivaling or exceeding that found in movie theaters.

In addition to DVD, surround sound is being integrated into personal computers and many new consumer media delivery systems. Among these are High Definition Television and the new digital television standard. This new technology will replace the older Dolby ProLogic surround technology. Soon all TV shows, sporting events, and commercials will be broadcast in surround sound. In addition, surround sound is currently available on most videotapes and laserdiscs.

Another area in which surround sound is emerging is recorded music. Currently, Digital Theater Systems (DTS) markets a CD-based technology that provides a high-quality six-channel audio technology for the home. Currently, industry standards committees are in the final stages of defining an audio-only DVD format. Initial music industry response to this technology has been extremely favorable.

Following is a list of current listening formats for surround sound:

5.1: Six-channel format popular in home theaters and movie theaters having left, center, and right speakers positioned in front of the listener, and left and right surround speakers behind the listener (see FIG. 2A).

7.1: Motion picture format having five full-range screen channels, two surround channels and one LFE channel. Also a consumer format with additional side or front channels (see FIG. 2B).

LCRS: Four-channel format having a single rear surround channel, often sent simultaneously to left and right surround speakers placed behind the listener (see FIG. 2C). Following is a list of current encoding formats for surround sound:

Discrete Multichannel: A system wherein audio channels are separately recorded, stored and played back.

Dolby Digital (AC-3): A digital encoding format for up to 5.1-channel audio using lossy data compression. Used in motion picture theatres and consumer audio and video equipment. Standard for DTV (digital television); used on most DVDs and many laserdiscs.

DTS: Refers to digital encoding formats from Digital Theater Systems. Used in motion picture theaters for up to eight (usually 5.1) channels, for discrete 5.1-channel music on CDs, and optional for video soundtracks on DVDs and laserdiscs.

Sony Dynamic Digital Sound (SDDS): A 7.1-channel format used in motion picture theaters.

Dolby Surround: A format used to encode LCRS audio for two-channel media, used in some television broadcasts, analog optical motion picture soundtracks, and VHS tapes; decoded using Dolby ProLogic.

Meridian Lossless Packing (MLP): A lossless data compression technique planned for use on the upcoming DVD-audio format.

One of the important aspects of creating surround sound is panning. That is, when creating surround sound, a source sound signal is "panned"to each of the separate discrete channels so as to add spatial characteristics such as direction to the sound. Low-frequency effects are mixed to a separate so-called LFE channel. The LFE channel carries non-essential effects enhancement, such as the low-frequency component of an explosion.

When surround sound was initially introduced, all dialog was mapped to the center channel, stereo was mapped to left and right channels, and ambient sounds were mapped to the surround (rear) channels. Recently, however, all channels are used to locate certain sounds via panning, which is particularly useful for sound sources such as explosions or moving vehicles.

The concept of panning will now be introduced with reference to FIGS. 3, 4A, and 4B. First, FIG. 3 illustrates the head-related transfer function (hrtf) $h(t,\phi)$, consisting of right ear and left ear components $h_L(t,\phi)$ (304) and $h_R(t,\phi)$ (305). Specifically, a source sound c(t) originating from speaker 300, located at an arrival angle $\phi$ from listener 301 will cause the listener to hear a sound in the left and right ears as signals l(t) (307) and r(t) (308) respectively, and in turn perceive the sound to be arriving from direction $\phi$. The left and right listener ear signals l(t) and r(t) thus can be determined as:

$$l(t)=h_L(t,\phi)*c(t) \quad \text{(Eq. 1)}$$

$$r(t)=h_R(t,\phi)*c(t) \quad \text{(Eq. 2)}$$

(where * represents a convolution operator)

FIG. 4A and FIG. 4B introduce the concept of panning with respect to stereo signals. As shown in FIG. 4A, a signal s(t) is applied to left and right speakers 409 and 411, respectively, via amplifiers 405 and 406. The left and right speakers are positioned from listener's 416 left ear by arrival angle $\phi_1$, and right ear by arrival angle $\phi_r$. Amplifiers 405 and 406 respectively provide a gain determined by panning weights $\gamma_1$ ($\alpha$) (403) and $\gamma_r$ ($\alpha$) (404) (where $\alpha$ is between 0 and 1).

FIG. 4B illustrates how a panning law is applied to determine how weights are applied to different speakers. As shown in FIG. 4B, a panning parameter $\alpha$ (representing, for example, a "fade"value between the left and right channels) is input to the panning law 417 to produce respective panning weights $\gamma_1$ ($\alpha$) and $\gamma_r$ ($\alpha$), shown as array 418. An application of one example of a panning law is where:

$$\gamma_l(\alpha)=\alpha \quad \text{(Eq.3)}$$

$$\gamma_r(\alpha)=1-\alpha \text{(Eq.4)}$$

When such a panning law is applied to the arrangement shown in FIG. 4A, the stereo speaker-to-ear impulse response (for each ear) of a panned source 410, $h_p(t)$, can be described as:

$$h_p(t)=\gamma_1 h(t,\phi_1)+\gamma_r h(t,\phi_r) \quad \text{(Eq.5)}$$

$$h_p(t)=\alpha h(t,\phi_l)+(1-\alpha)h(t,\phi_r) \quad \text{(Eq.6)}$$

It turns out that the speaker-to-ear impulse response of an actual sound source at direction $\phi_a$ (where $\phi_a=\alpha\times\phi_l+(1-\alpha)\times\phi_r$), approximates the panned impulse response for closely spaced speakers, that is $$h_p(t)\approx h(t,\phi_a) \quad \text{(Eq.7)}$$

and, as a result, panning between speakers has the perceptual effect of a single speaker positioned at $\phi_a$.

FIGS. 5A and 5B further illustrate how the above panning concepts are applied to surround sound systems. As shown in FIG. 5A, a source sound signal s(t) is applied to a set of speakers i=1 to N via respective amplifiers 501 . . . 503. Each amplifier i applies a gain determined by respective panning weights $\gamma_i(\eta)$ so as to produce separate channel signals $c_i(t)$, where $c_i(t)$ is defined as:

$$c_i(t)=\gamma_i(\eta)s(t) \quad \text{(Eq.8)}$$

As shown in FIG. 5B, each respective panning weight $\gamma_i(\eta)$ (512) is determined by panning law 511, which yields each panning weight as a function of panning parameters $\eta$ and speaker location $\phi_i$.

FIG. 6 introduces how conventional surround sound panning techniques are applied for controlling the front/back and left/right panning variables of speakers 600–604. In the example provided herein, a conventional 5.1 surround sound format as described above is presented. Conventionally, the soundfield of the surround sound system is represented by a Cartesian grid 609 defined between speakers 600–604. The indicator 610 represents the position of a sound source as it is intended to be perceived by a listener centrally positioned within the grid 609 defined by the surround sound speakers as a result of the application of the sound source through the five speaker channels of the surround sound system. As will be described in more detail below, panning techniques are used to adjust the relative strength of the source sound signal as a function of the position of indicator 610.

FIGS. 7A–7D illustrate how panning concepts are conventionally applied to the conventional 5.1 surround sound format. As shown in FIG. 7A, panning weight $\gamma_c(x,y)$ (703) is determined by panning law 702, which yields the panning weight as a function of x, y, and $\eta_c$. When x has a value of 0, this corresponds to the position of indicator 610 being on the left edge of grid 609, and x is 1 when the position of indicator 610 is on the right edge of grid 609. Similarly, when y has a value of 0, this corresponds to the position of indicator 610 being on the back edge of grid 609, and y is 1 when the position of indicator 610 is on the front edge of grid 609.

Next, FIGS. 7B and 7C illustrate graphs having $\lambda_i(x)$ on the vertical axis and x on the horizontal axis. In FIG. 7B, line 710 represents the x-direction panning law function for rear left speaker 603. As shown, it has a linear slope having a negative value 1 intersecting the horizontal axis at x=1. Conversely, line 711 representing the x-direction panning law function of the rear right speaker 604 has a linear slope of positive value of 1 intersecting the horizontal axis at x=0.

In FIG. 7C, the line 712 representing the x-direction panning law function of the left front speaker 600 also has a linear slope having a negative value of 2 intersecting the horizontal axis at x=0.5, while line 714 representing the x-direction panning law function of the right front speaker 602 has a linear slope of a positive value of 2 intersecting the horizontal axis at x=0.5. Furthermore, the line 713 representing the x-direction panning law function of center front speaker 601 has a positive linear slope of 2 from x=0 to x=0.5 intersecting the horizontal axis at x =0, and then a negative linear slope of 2 from x =0.5 to x =1.

FIG. 7D illustrates a graph having $\upsilon_i$ (y) on the vertical axis and y on the horizontal axis. As described earlier, y represents the front/back position of the indicator 610 in the grid 609. The line 715 representing the y-direction panning law function of all three front speakers 600, 601, 602 is a linear slope having a negative value 1 intersecting the horizontal axis at y=1. Conversely, line 716 representing the y-direction panning law function of the two right speakers 603, 604 is a linear slope having a positive value of 1 intersecting the horizontal axis at y=0.

Combining the equation and graphs of FIGS. 7A–7D, the following relationship is formed, where $\gamma_{ci}$ is the panning weight for speaker i and x and y represent the front/back and left/right position, respectively, of the joystick.

$$\gamma_{ci}(x, y)=\lambda_i(x)\upsilon_i(y) \quad \text{(Eq.9)}$$

Although the conventional surround panning system and method described above is widely used, problems remain. For example, one such problem relates to divergence. Sound tends to accumulate in the center channel of a surround sound system. When excess energy is channeled to the center without controlling divergence, the surround sound quality is less than optimal. Conventionally, divergence is controlled by merely distributing a portion of the energy in the center channel among the front channels (i.e., the L, C and R channels in a 5.1 system). However, this is not effective in all situations.

Moreover, and on a related note, recent years have seen a revolution in the way audio is recorded, produced and mastered. Computers have radically changed the way in which people produce audio, as well as the nature of the audio processing systems upon which they depend. Digital technology has made it possible for small studios and even individuals to produce high-quality recordings without exorbitant investments in equipment. This has fueled a rapidly growing marketplace for audio-related hardware and software. Individuals and small studios now have within their reach high-quality, sophisticated equipment which was historically the sole domain of large studios. Traditionally, to be able to create professional quality recordings, one needed expensive large recording consoles as well as high-cost tape machines and other equipment. Through digital technology, the digital audio workstation (DAW) has emerged, combining recording, mixing, and mastering into a single or several software packages running on a standard personal computer using one or more digital audio soundcards. The price of these DAWs can range from about $4000 to $30,000. These low-cost, high-quality recording solutions have created a rapidly growing market.

Currently, the availability of surround sound production tools lags behind that of other audio production technology. At present, most surround sound is recorded and mixed on expensive large consoles costing upwards of several hundred thousand dollars. The increasing amount of material recorded in surround sound has created a demand for lower cost digital audio workstations which have multi-channel (surround sound) output capability. Despite the existence of numerous high-quality computer-based sound cards capable of being used for surround sound production, surround sound processing software is not readily available.

A growing segment in the DAW market is plug-in effects processing technology. In traditional settings, studios are equipped with mixing consoles with which the recording engineer controls and manipulates sound. Additionally, the recording engineer will make use of so-called "outboard" equipment which is used to process or alter the recorded sound. Recording engineers will use cables to patch the desired piece of equipment into the appropriate place on the recording console. In the world of the DAWs, the same paradigm holds, with individual software components replacing the outboard equipment. In this way, one company can produce a piece of software which functions as the mixing console, while a third party can produce the software which replaces outboard equipment such as equalizers and reverberators. When software that functions as outboard equipment is "plugged in" to the processing chain, it is said to be a piece of "plug-in" technology. This is much the same situation as Microsoft producing MS-Word, with third parties producing macros and templates which are purchased separately, but function in the context of MS-Word.

Currently, one of the most widely used audio production platforms is Pro Tools from Digidesign of Palo Alto, Calif. This DAW system has gained widespread acceptance among audio production professionals and currently has a base of about 25,000 users.

An example of a conventional plug-in application for Pro Tools that implements conventional surround sound panning techniques is Dolby Surround Tools.

With reference to FIG. 6, Surround Tools displays an interface including the grid 609 and indicator 610 is typically moved about the interface 609 using a joystick (not shown) in the x-y directions. Alternatively, slideable controls 606, 608 can be used to move the indicator 610 in the x and y directions, respectively.

The problems with conventional surround sound panning techniques and conventional means and interfaces for controlling surround sound panning will now be described.

Importantly, the conventional surround sound panning techniques do not accurately convey the psychoacoustics of surround sound. Accordingly, there remains a need in the art for a surround sound panning technique that more accurately conveys the psychoacoustics of surround sound.

There are other drawbacks to the traditional panning techniques described above. For example, conventional panning methods are not believed to be easily adjustable to different speaker configurations and do not adapt well to different speaker arrays.

Additionally, in the conventional interface for controlling surround sound panning such as Surround Tools, the amount of screen space available to the interface will determine the amount of precision of control of the panning weights. Accordingly the amount of screen space needed to precisely control the sounds from the speakers can be exorbitant.

SUMMARY OF THE INVENTION

Accordingly, an object of the present invention is to provide a surround sound panning method and apparatus that overcomes the disadvantages of the prior art.

Another object of the present invention is to provide a surround sound panning method and apparatus that accurately conveys the psychoacoustics of surround sound.

Another object of the present invention is to provide a surround sound panning method and apparatus that can be implemented in a conventional DAW audio production environment.

Another object of the present invention is to provide a surround sound panning method and apparatus that has an interface that allows independent adjustment of sound position and spatial extent.

Another object of the present invention is to provide a surround sound panning method and apparatus that provides snap points that instantly moves a joystick to speaker locations.

Another object of the present invention is to provide a surround sound panning method and apparatus that provides flexible panning modes that allow any channel to be selected or disabled (e.g., disable center channel for 4.0 mix).

Another object of the present invention is to provide a surround sound panning method and apparatus in which multiple tracks may be linked and panned with a single control.

The present invention achieves these objects and others by introducing a novel surround sound panning paradigm. Rather than controlling the x-y position within a linear grid, the invention characterizes the sound by specifying an azimuth and width, which parameters are used in a novel panning law to control each output channel. In a preferred implementation, the panning control is provided in a Plug-In application for a conventional DAW environment such as Pro Tools, which application includes an interface that provides precise control over the direction and spatial extent of audio.

BRIEF DESCRIPTION OF THE DRAWINGS

These and other objects and advantages of the present invention will become apparent to those skilled in the art after considering the following detailed specification, together with the accompanying drawings wherein.

DETAILED DESCRIPTION OF THE INVENTION

Figure 9A:
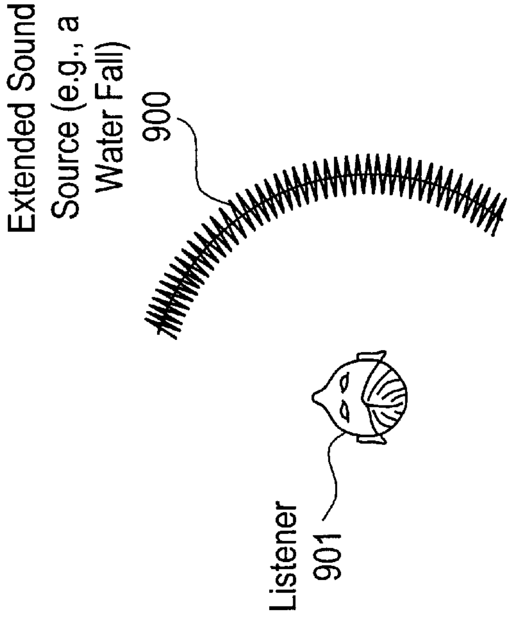
FIGS. 9A–9B illustrates the novel surround sound paradigm of the present invention.

FIG. 9A introduces the novel surround sound panning paradigm of the present invention. As shown, listener 901 receives sounds 900 from an extended source positioned to the right of the listener. Rather than specifying a point that represents the position of the sound source, the present invention considers the direction of arrival and "spatial extent" or "width" of the sound. Thus, in FIG. 9B, the signals that are panned among the surround sound speakers such as speakers 902–904 can convey the perceived location and spatial extent or width of the sound source.

Figure 9B:
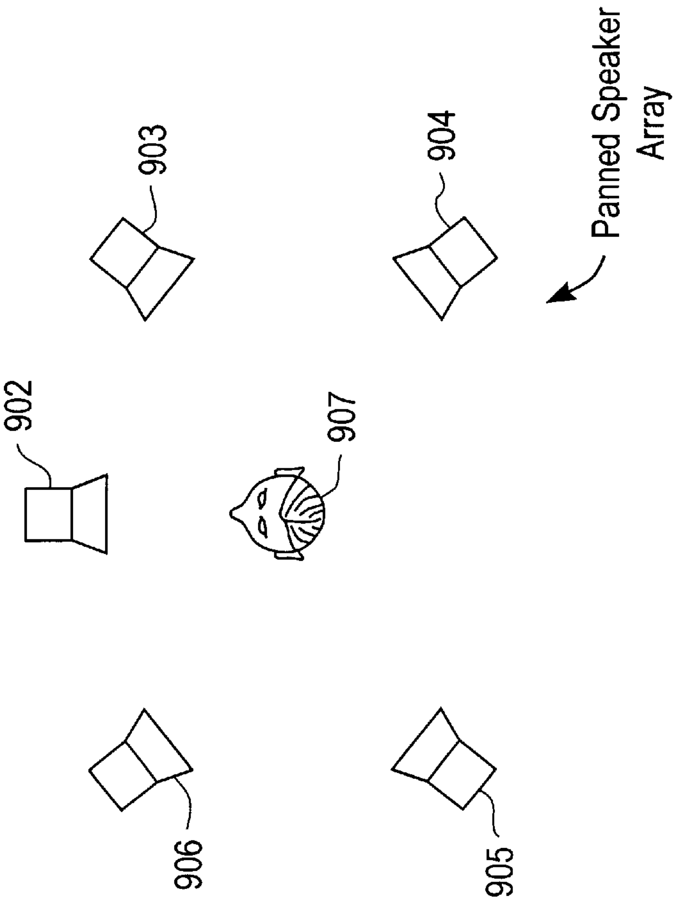
Figure 10:
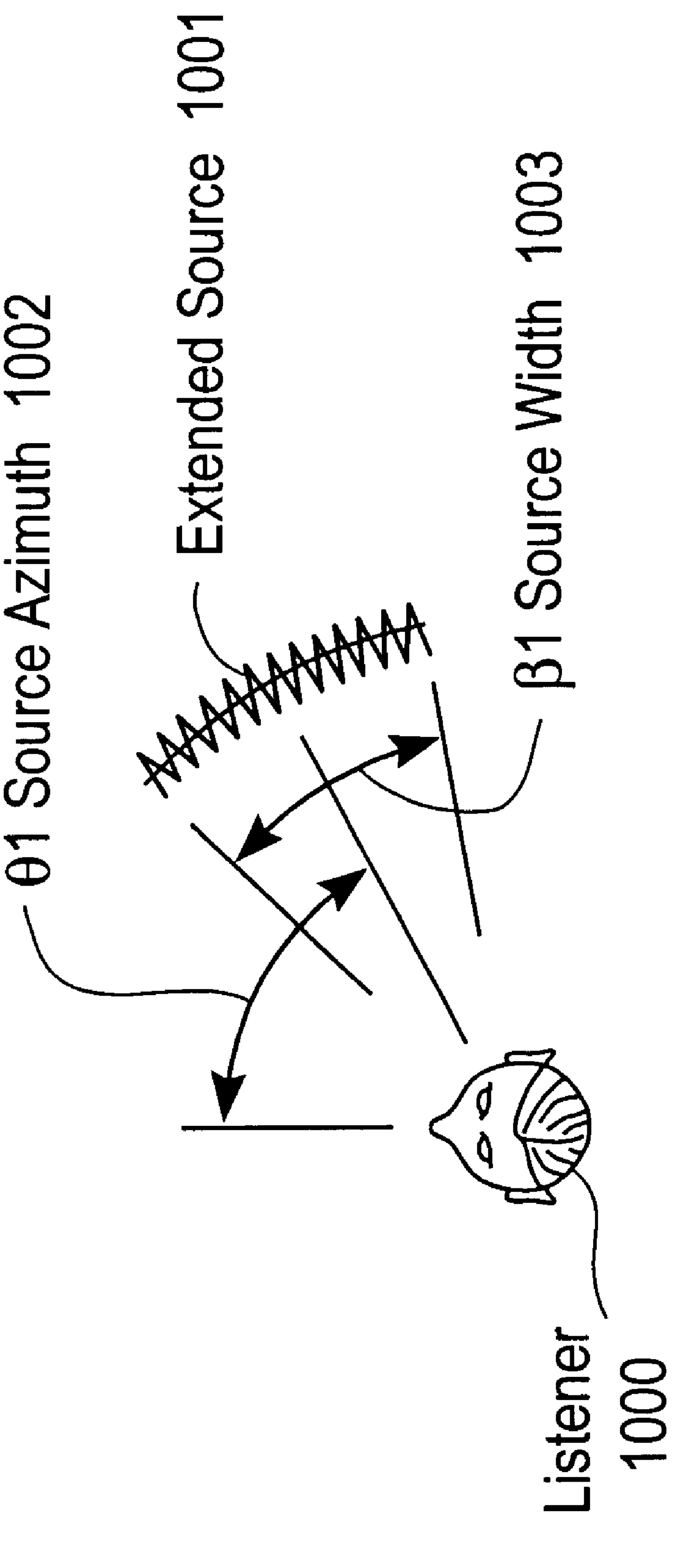
FIG. 10 illustrates panning parameters of the present invention.

FIG. 10 illustrates the novel panning parameters in accordance with the present invention. The present invention uses panning parameters of azimuth and width to characterize the intended perceived soundfield. Combining the panning parameters of the azimuth θ (1002) and width β (1003), an extended sound source 1001 is specified. Preferably, the width 1003 is distributed equally around the azimuth. However, it should be apparent that this is not necessary. Furthermore, as shown in FIG. 9B, the speakers 902–906 are preferably located equiradially about listener 907 at respective azimuth angles. However, it should be apparent that this is not necessary either and other variations are possible.

Figure 11B:
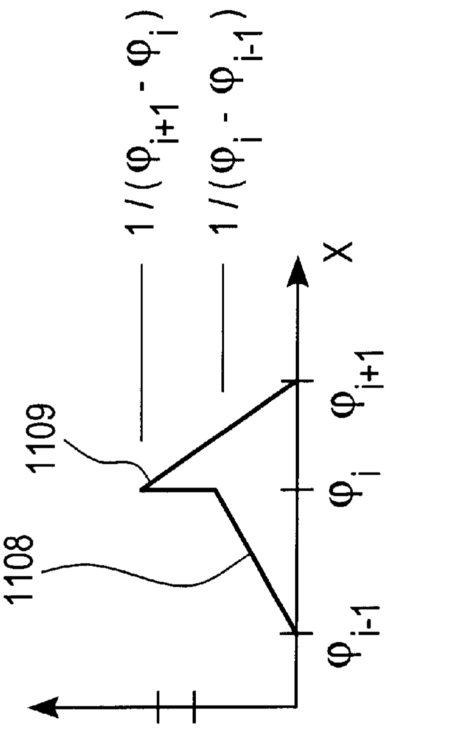
FIGS. 11A–11B illustrates a novel panning method according to the present invention.
Figure 11A:
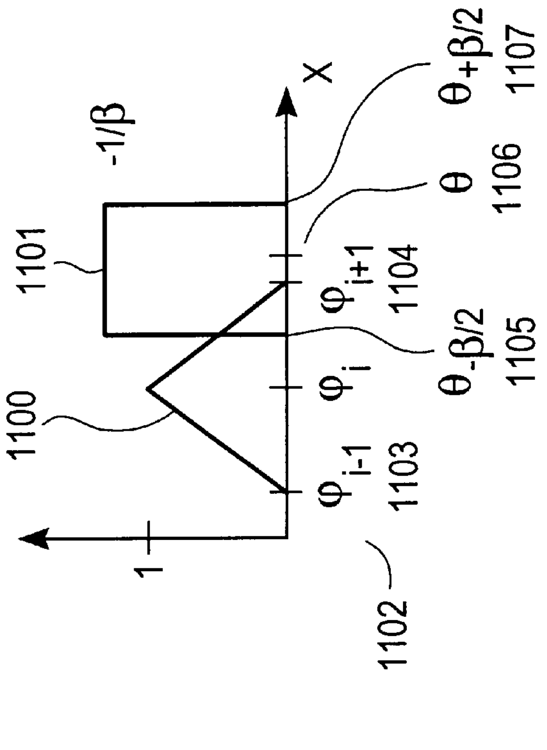

FIGS. 11A–11B illustrate the novel panning method of the present invention. According to the panning method of the present invention, panning weights for respective surround sound channels are determined by performing an integral as follows:

$$\gamma_{pi}(\eta_p)=\int\psi=0 \text{ to } 2\pi\{d\psi f_i(\psi,\phi)p(\psi,\theta,\beta)\} \quad \text{(Eq.10)}$$

The $i^{th}$ value in the $\gamma_{pi}(\eta_p)$ represents the panning weight of the i-th surround sound channel, and $\eta_p$ represents the panning parameters relating to the azimuth and width. According to the present invention, the function $f_i(\psi,\phi)$, the speaker fade function, is represented as a line 1101 having a value of 1 corresponding to the angle $\phi_i$ at which the speaker i is positioned, and 0 at angles corresponding to neighboring speakers. It should be apparent, therefore, that the speaker fade function is somewhat related to the configuration of the speakers (i.e., the number and placement of the speakers). The function p(ψ,θ,β), the panning profile, corresponds to the line 1101 having a height of 1/β (in radians) centered about azimuth θ. Panning profile, which is new in accordance with an aspect of the invention, represents the desired perceived signal energy as a function of direction of arrival, and reflects the present invention's consideration of the "spatial extent" of the perceived sound.

FIG. 11B further illustrates an alternative speaker fade function $f_i(\psi,\phi)$ 1108, 1109. It should be apparent that other functions may be used for the speaker fade function and panning profile, and the invention is not limited to these particular examples. Rather, the invention concerns surround sound panning in which the panning weights are derived in the novel and useful way of integrating the speaker fade function and panning profile, which takes into consideration the "spatial extent" of the perceived sound, as specified by novel panning parameters width and azimuth.

Figure 12:
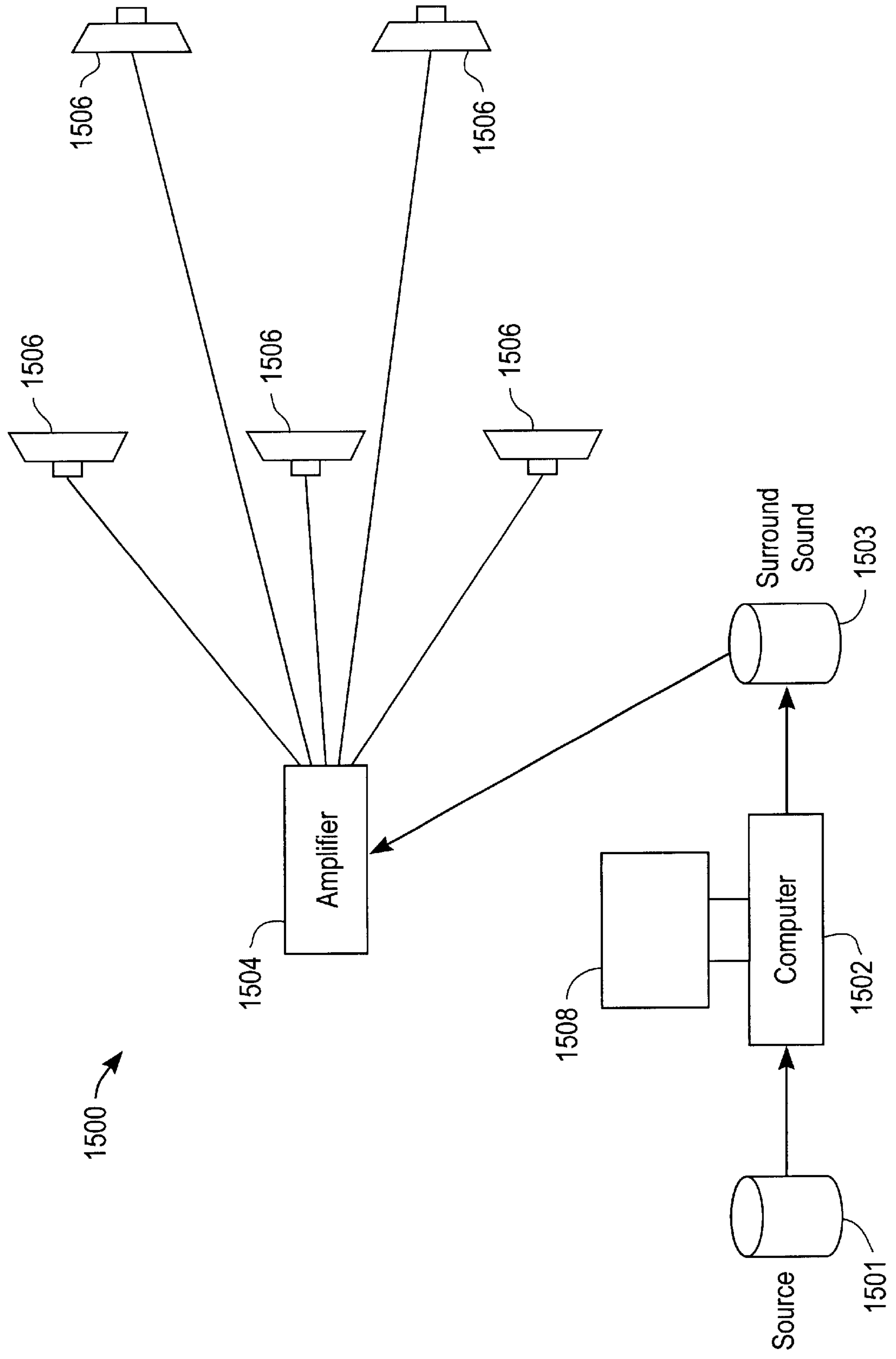
FIG. 12 illustrates an apparatus for implementing the surround sound panning techniques of the present invention.

FIG. 12 illustrates an example of an apparatus used to implement the surround sound panning techniques of the present invention. The system 1500 includes at least one electronic device 1502 that receives a sound source that is to be panned for surround sound. The sound source can be a signal stored in a recordable medium 1501, for example. Electronic device 1502 implements the panning method illustrated in FIG. 11 using a software program, for example, and creates surround sound in a format such as 5.1The surround sound is then stored in a recordable medium 1503, for example. The amplifier 1504 receives the surround sound and is coupled to surround sound speakers 1506. In other embodiments, the electronic device 1502 may be directly coupled to the speakers 1506. The electronic device 1502 can be any known device capable of executing software such as a computer. Alternatively, other electronic devices, such as wireless devices, may also be used in accordance with the present invention.

Generally, the electronic device 1502 includes a display device 1508, and a keyboard, keypad, or mouse (not shown) for inputting data. The software program implementing the surround sound panning method of the present invention interacts with these input devices to control and display the azimuth and width panning parameters, apply the parameters to the received sound signal using the method described above in connection with FIGS. 11A–11B, and store and perhaps playback the surround sound. Preferably, the software program interacts with these input devices via a user interface program also executing in electronic device 1502, as will be described in more detail below.

Figure 13B:
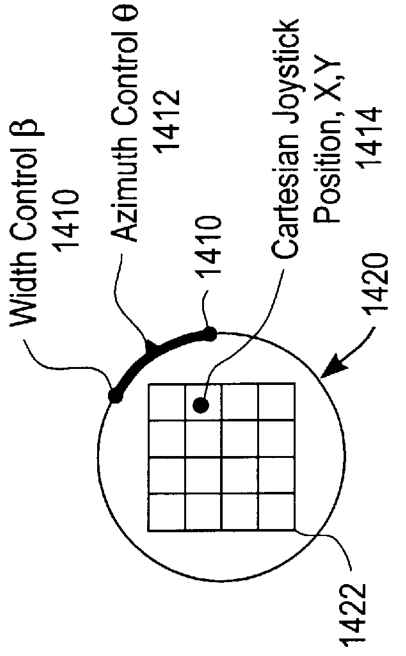
FIGS. 13A–13C illustrate exemplary panning controls and displays of a user interface capable of being used in the present invention.
Figure 13C:
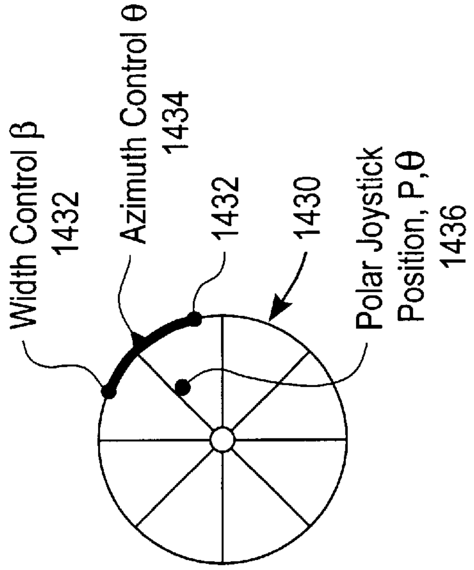
Figure 13A:
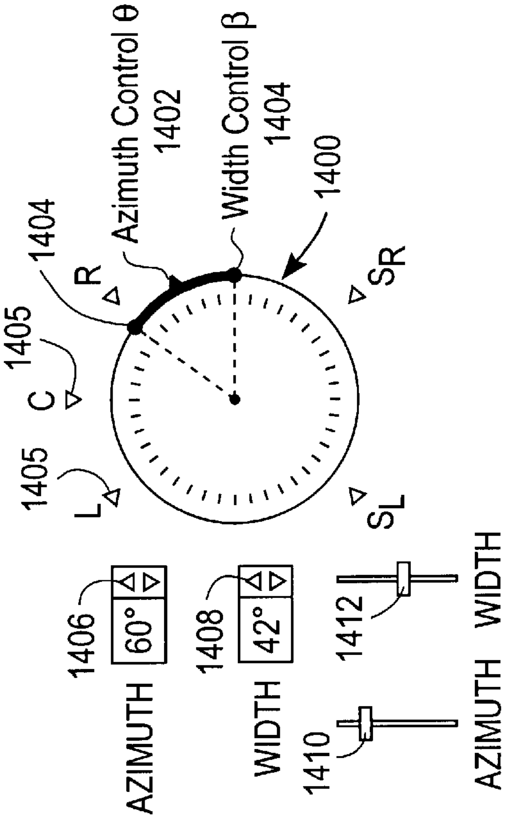

FIGS. 13A–13C illustrate panning controls and displays that can be used in the user interface associated with the apparatus in FIG. 12 for controlling and displaying the azimuth and width parameters used to pan surround sound according to the present invention. FIG. 13A illustrates various methods for controlling and displaying the azimuth and width parameters using a mouse device. For example, an interface 1400 may be used to control the azimuth by positioning a mouse on and dragging knob 1402, and width may be controlled by positioning a mouse on and dragging knobs 1404. Alternatively, controls 1406, 1408 may be used to increase and decrease a number representing the angle of the azimuth and width. Further, slideable controls 1410 and 1412 may also be used to control the azimuth and width of the present invention. Moreover, "detents" 1405 can be provided at the respective speakers to "snap" the azimuth to their locations by positioning a mouse on the detent and clicking.

Next, FIG. 13B illustrates a grid used for controlling the azimuth and width using a joystick (not shown). The Cartesian joystick position 1414 on the x-y coordinates is converted to width 1410 and azimuth 1412 in accordance with a standard conversion. The joystick can be moved anywhere along the grid 1422 for adjusting the azimuth and width. FIG. 13C further illustrates another method of controlling the azimuth and width using an inscribed polar joystick. The polar joystick is positioned at any point 1436 in the interface 1430 such that a corresponding azimuth 1434 and width 1432 can be determined by conversion. In accordance with an aspect of the invention, the following relationships will allow conversion between azimuth, width values, x, y coordinate values and polar coordinate values:

$$\theta=a\tan 2(x,y)$$

$$\beta=2\pi[1-(x^2+y^2)^{1/2}]\max\{|\sin\theta|,|\cos\theta|\}$$

$$\rho=1-(\beta/2\pi)$$

$$x=\rho\sin\theta/\max\{|\sin\theta|,|\cos\theta|\}$$

$$y=\rho\cos\theta/\max\{|\sin\theta|,|\cos\theta|\}$$

Figure 14:
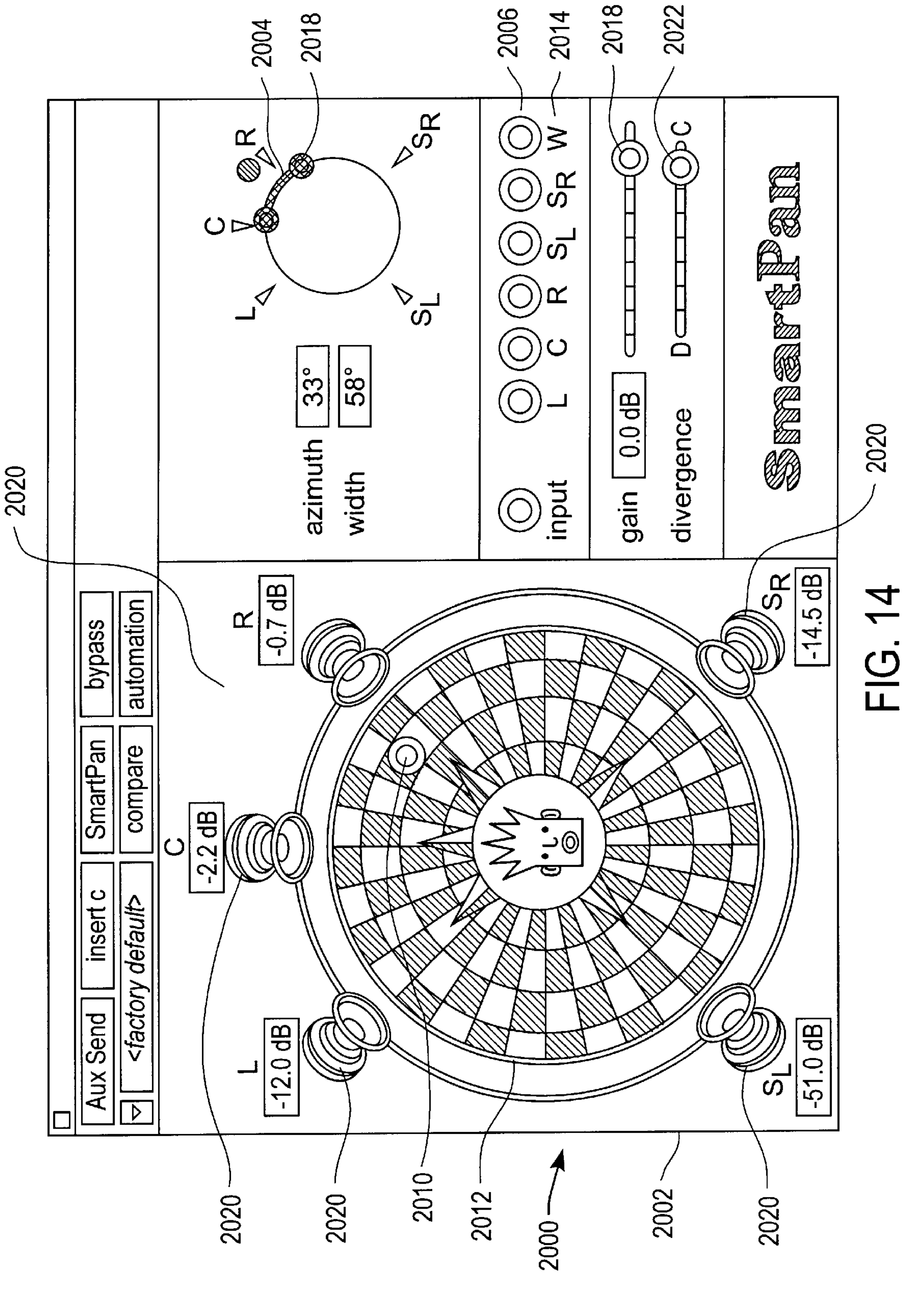
FIG. 14 illustrates a user interface window for controlling panning parameters of the present invention.

FIG. 14 illustrates a preferred user interface window for controlli panning parameters of the present invention. In the preferred embodiment, the panning control is provided in a Plug-In application for a conventional DAW environment such as Pro Tools, which application includes an interface that provides precise control over the direction, spatial extent and placement of audio in a soundfield.

The following describes a preferred implementation of the panning method and apparatus according to the invention in a digital audio workstation environment. For example, the method and apparatus can be implemented as a Plug-In application within a Pro Tools |24, Pro Tools 24|MIX or MixPro environment, using a surround sound speaker system (5.1, 7.1 or LCRS). It allows Pro Tools to generate six-channel surround mixes by allocating three stereo channels to serve as a virtual output bus. The Plug-In preferably supports panning and preview of a full six-channel surround sound mix completely within the Pro Tools environment. This provides capability to create a mix for Dolby Digital, DTS, DVD Audio or other surround formats including 7.1 and LCRS.

By implementing the panning techniques according to the invention, the Plug-In provides a Pro Tools solution that accurately conveys the psychoacoustics of surround sound panning. To accomplish this, the Plug-In user interface offers two options for positioning sound elements. For those accustomed to a traditional joystick controller, a visual representation of joystick sound placement can be provided. However, preferably, as illustrated in FIG. 14, a mouse-controlled puck 2010 indicates the position of audio in the soundfield 2012; as the puck is moved, changing soundfield parameters and channel gains 2014 are displayed. In addition, a control knob 2018 provides the capability to not only pan sound among speakers 2020, but also provides the capability to intuitively and accurately adjust the width, or spatial extent, of the sound. Either interface provides precise control over the direction, spatial extent and placement of audio.

The Plug-In's divergence control 2022 provides the capability to adjust the L/C/R panning law. Sub-woofer/LFE management features are also provided, including adjustable filtering and independent level adjustment. For complex effects, multiple Pro Tools tracks may be linked and panned as a group. All Plug-In functions may be automated.

The following Matlab module in Table I, also executing as a Plug-in application in the Pro Tools DAW environment, generates the set of filters and mixing parameters needed to implement the Plug-In's channel surround sound panner specified by the api parameters set in the initialization section, and thereby implements the panning method of the present invention.

TABLE I

| Code | Comments |
|---|---|
| | %% initialization |
| buildVersion = '1.0'; | %% sp5api2dsp version, 'x.y' |
| buildDate = date; | %% script generation date, 'dd-mmm-yy' |
| buildTime = time; | %% script generation time, 'hh:mm:ss' |
| | %% surround configuration |
| satphi = [−45 0 45 120 −120] * pi/180; | %% satellite speaker azimuths, radians |
| satlabels = ['L'; 'C'; 'R'; 'SR'; 'SL']'; | %% satellite channel labels, string |
| nS = length(satphi); | %% number of satellite channels, count |
| [satphi order] = sort(satphi); | %% sorted speaker azimuths |
| satlabels = satlabels(:,order); | %% sorted speaker labels |
| | %% constants |
| fs = 44100; | %% sampling rate, Hz |
| beta = 0.2; | %% SmartPan width at joystick radius 0.5, radians/(2*pi) in (0,1) |
| | %% controls |
| Bimute = 0; | %% input mute button, boolean |
| Bsmute = [0 0 1 0 0]; | %% satellite channel output mute buttons, boolean array |
| Bwmute = 0; | %% subwoofer channel mute button, boolean |
| dBinput = 0.0; | %% input gain dB slider, dB in (-inf,12] |
| dBsubwoofer = 0.0; | %% subwoofer gain dB slider dB in (-inf,12] |
| dBsurround = 0.0; | %% surround gain dB slider, dB in (-inf,12] |
| Sdivergence = 1.0; | %% center channel divergence slider, fraction in [0,1] |
| Snormalization = 1.0; | %% panning normalization slider, fraction in [0,1] |
| Bsubfilter = 0; | %% subwoofer low-pass filter selection button, boolean |
| EsubFc = 80.0; | %% subwoofer low-pass filter cuttoff frequency, Hz in [10,fs/2] |
| Bsatfilter = 0; | %% satellite high-pass filter selection button, boolean |
| EsatFc = 80.0; | %% satellite high-pass filter cuttoff frequency, Hz in [10,fs/2] |
| SPazimuth = 42.0 * pi/180; | %% SmartPan azimuth control, radians in [-pi,pi] |
| SPwidth = 60.0 * pi/180; | %% SmartPan width control, radians in [0,2*pi] |

TABLE I-continued

| Code | Comments |
|---|---|
| JSx = []; | %% joystick x-axis value, position in [-1,1] |
| JSy = []; | %% joystick y-axis value, position in [-1,1] |
| | %% generate signal processing parameters |
| | %% form azimuth and width |
| if ~(isempty('SPazimuth') & isempty('SPwidth')), azimuth = SPazimuth; width = SPwidth; | %% SmartPan azimuth and width controls set |
| else, azimuth = atan2(JSy,JSx); rho = sqrt(JSx^2 + JSY^2); gamma = 2*(beta − 0.5)/((beta + 0.5)*(beta − 1.5)); if (gamma == 0); width = 2*pi * (1 − rho); else, width = 2*pi * (1 − (((gamma−1)/gamma) * (1−sqrt(1 + 4*gamma*rho)/((1−gamma)^2))) − rho)); end; end; | %% SmartPan joystick control set |
| | %% form input gain |
| temp = (dBinput/20) * log2(10); | |
| Sinput = floor(temp); | %% shift (exponent) |
| Finput = Bimute * 2 ^ (temp − Sinput); | %% fractional part |
| | %% set surround gains |
| temp = (dBsurround/20) * log2(10); | |
| Ssurround = floor(temp); | %% shift (exponent) |
| Fsurround = 2 ^ (temp − Ssurround); | %% fractional part |
| | %% set subwoofer gain |
| temp = (dBsubwoofer/20) * log2(10); | |
| Ssubwoofer = floor(temp); | %% shift (exponent) |
| Fsubwoofer = Bwmute * 2 ^ (temp − Ssubwoofer); | %% fractional part |
| | %% design subwoofer low-pass filter |
| if Bsubfilter, [z, p, k]= butter(4,EsubFc/(fs/2)); SOSsubwoofer = zp2sos(z,p,k); else, SOSsubwoofer = [1 0 0 1 0 0]; end; | |
| | %% design satellite high-pass filter |
| if Bsatfilter, [z, p, k] = butter(2,EsatFc/(fs/2), 'high'); SOSsatellite = zp2sos(z,p,k); else, SOSsatellite = [1 0 0 1 0 0]; end; | |
| | %% form panning weights |
| if (width <= 0), width = pi/180; end; | %% zero width source |
| active = find(~Bsmute) nA = length(active); phi = [satphi(active(nA))− 2*pi satphi(active) satphi(active(1))+2*pi]; weight = zeros(1,nA); for i = [1:nA], | |
| lo = max(azimuth−width/2, phi(i)) − phi(i); hi = min(azimuth+width/2, phi(i+1)) − phi(i); temp = (lo <= hi) * (hi^2 − lo^2) / (phi(i+1)−phi(i)); lo = max(azimuth−width/2−2*pi, phi(i)) − phi(i); hi = min(azimuth+width/2−2*pi, phi(i+1)) − phi(i); | %% integrate eta < phi |

TABLE I-continued

| Code | Comments |
|---|---|
| temp = temp + (lo <= hi) * (hi^2 − lo^2) / (phi(i+1)−phi(i)); | |
| lo = max(azimuth−width/2+2*pi, phi(i)) − phi(i); | |
| hi = min(azimuth+width/2+2*pi, phi(i+1)) − phi(i); | |
| temp = temp + (lo <= hi) * (hi^2 − lo^2) / (phi(i+1)−phi(i)); | |
| lo = max(azimuth−width/2, phi(i+1)) − phi(i+2); | %% integrate eta > phi |
| hi = min(azimuth+width/2, phi(i+2)) − phi(i+2); | |
| temp = temp + (lo <= hi) * (lo^2 − hi^2) / (phi(i+2)−phi(i+1)); | |
| lo = max(azimuth-width/2−2*pi, phi(i+1)) − phi(i+2); | |
| hi = min(azimuth+width/2−2*pi, phi(i+2)) − phi(i+2); | |
| temp = temp + (lo <= hi) * (lo^2 − hi^2) / (phi(i+2)−phi(i+1)); | |
| lo = max(azimuth−width/2+2*pi, phi(i+1)) − phi(i+2); | |
| hi = min(azimuth+width/2+2*pi, phi(i+2)) − phi(i+2); | |
| weight(i) = temp + (lo <= hi) * (lo^2 − hi^2) / (phi(i+2)−phi(i+1)); | |
| end; | |
| Gsatellite = zeros(1,nS); | |
| Gsatellite(active) = weight/(sum(weight) + eps); | |

The following Matlab module in Table II translates azimuth and width into polar and Cartesian joystick coordinates.

TABLE II

| Code | Comments |
|---|---|
| | %% initialization |
| azimuth = 42 * pi/180; | %% SmartKnob azimuth, radians in [-pi,pi] |
| width = 60 * pi/180; | %% SmartKnob width, radians in [0,2*pi] |
| | %% form polar joystick parameters |
| rho = (1 − width/(2*pi)); | %% polar joystick radius |
| px = rho * sin(azimuth); | %% polar joystick left/right position |
| py = rho * cos(azimuth); | %% polar joystick front/back position |
| | %% form cartesian joystick parameters |
| gamma = 1/max(abs(sin(azimuth)), abs(cos(azimuth))); | |
| cx = gamma * px; | %% cartesian joystick left/right position |
| cy = gamma * py; | %% cartesian joystick front/back position |

The following Matlab module in Table III translates polar and Cartesian joystick coordinates to azimuth and width.

TABLE III

| Code | Comments |
|---|---|
| | %% initialization |
| cx = 0.5; | %% cartesian joystick left/right position, fraction in [−1,1] |
| cy = 0.7; | %% cartesian joystick front/back position, fraction in [−1,1] |
| | %% form polar joystick parameters |
| azimuth = atan2(cx,cy); | %% SmartKnob azimuth, radians |
| gamma = max(abs(sin(azimuth)), abs(cos(azimuth))); | |
| px = gamma * cx; | %% polar joystick left/right position |
| py = gamma * cy; | %% polarjoystick front/back position |
| | %% form SmartKnob width |
| width = 2*pi*(1 − sqrt(px^2 + py^2)); | %% SmartKnob width, radians |

Figure 8A:
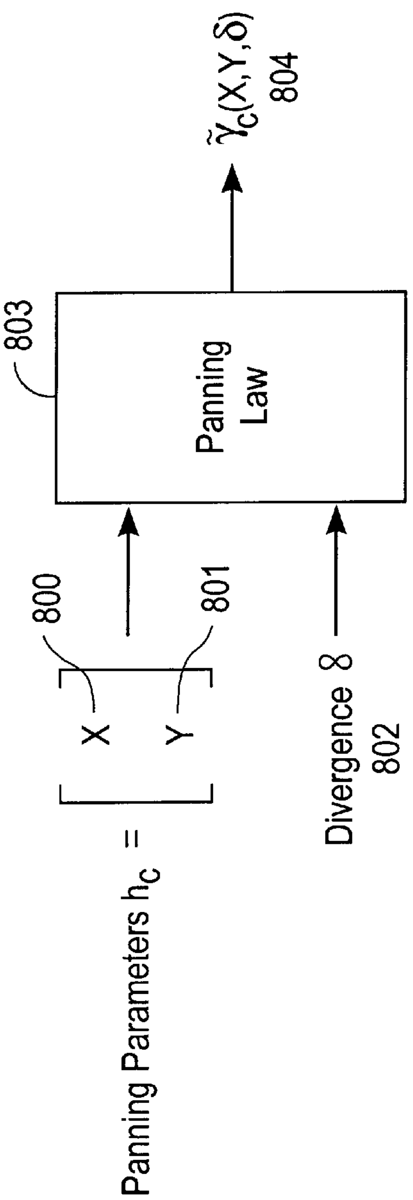
FIGS. 8A–8B illustrate the panning concepts as applied to the surround sound format with divergence in accordance with the present invention.
Figure 8B:
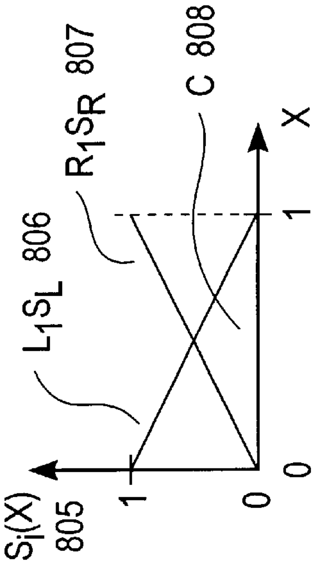

FIGS. 8A–8B illustrate a technique for controlling divergence in accordance with the present invention. As shown in FIG. 8A, panning parameter $\eta_c$ and divergence δ(802) are input to panning law 803 to come up with the modified panning weight $\gamma'_c(x, y, \delta)$ (804). The modified panning weight can also be stated as follows:

$$\gamma'_c(x, y, \delta)=(1-\delta)\gamma_{c,N}(x, y)+\delta\gamma_{c,N-1}(x, y) \qquad \text{(Eq.11)}$$

The $\gamma_{c,N}$ in equation 11 represents a generic N-channel panning weight. Accordingly, to represent the $i^{th}$ channel weight in a conventional 5.1 surround sound system illustrated in FIG. 6, the following equation can be used:

$$\gamma_{ci}(x, y, \delta)=(1-\delta)\ \gamma_i(x)\upsilon_i(y)+\delta\zeta_i(x)\upsilon_i(y) \qquad \text{(Eq.12)}$$

Figure 1:
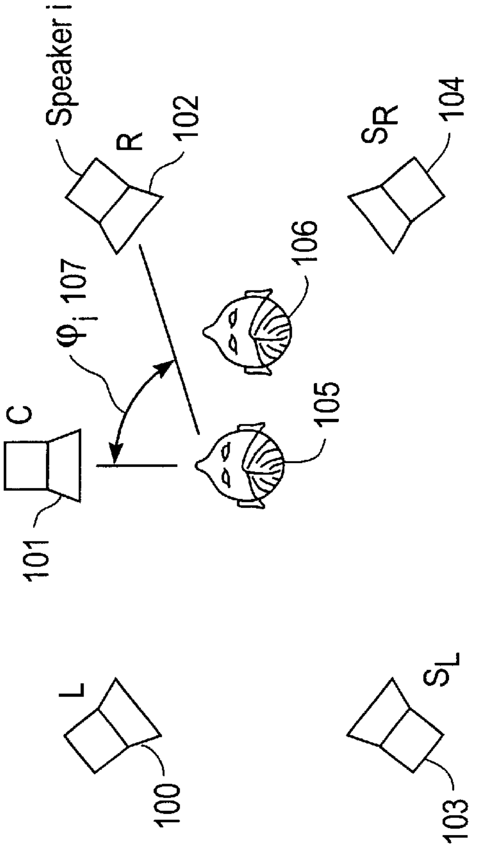
FIG. 1 (PRIOR ART)
FIG. 1 illustrates a conventional surround sound system having multiple listeners and speakers.
Figure 2A:
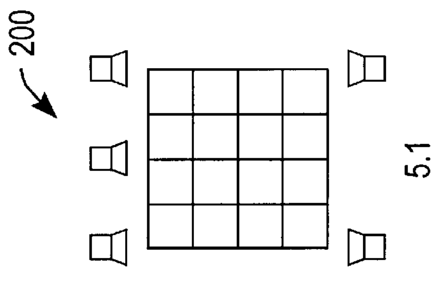
FIG. 2A (PRIOR ART)
FIG. 2A illustrates a conventional 5:1 surround sound format.
Figure 2B:
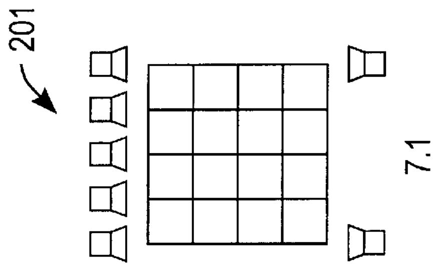
FIG. 2B (PRIOR ART)
FIG. 2B illustrates a conventional 7:1 surround sound format.
Figure 2C:
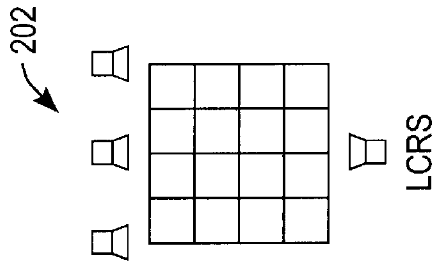
FIG. 2C (PRIOR ART)
FIG. 2C illustrates a conventional LCRS surround sound format.
Figure 3:
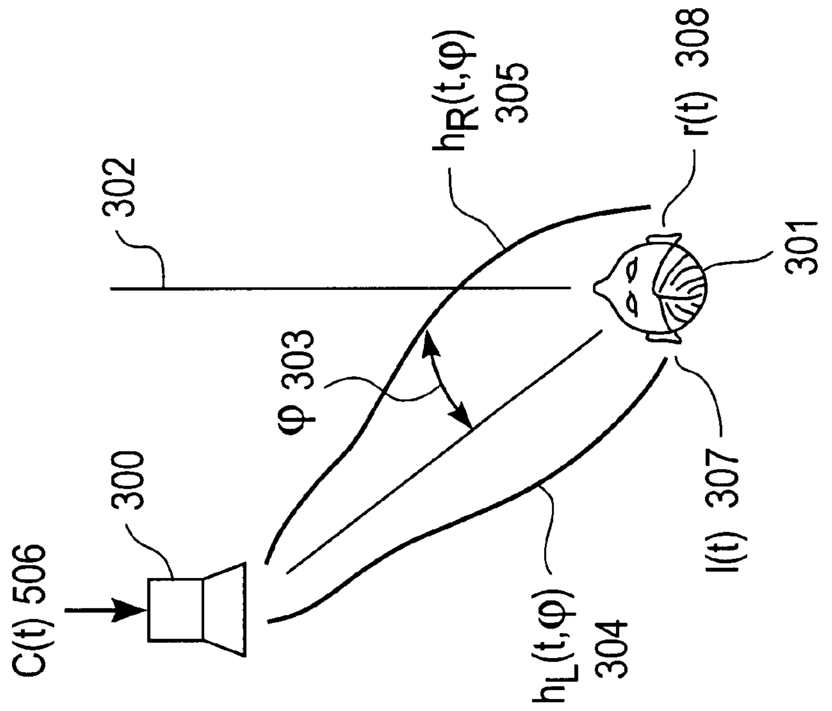
FIG. 3 (PRIOR ART)
FIG. 3 illustrates the head-related transfer function.
Figure 4A:
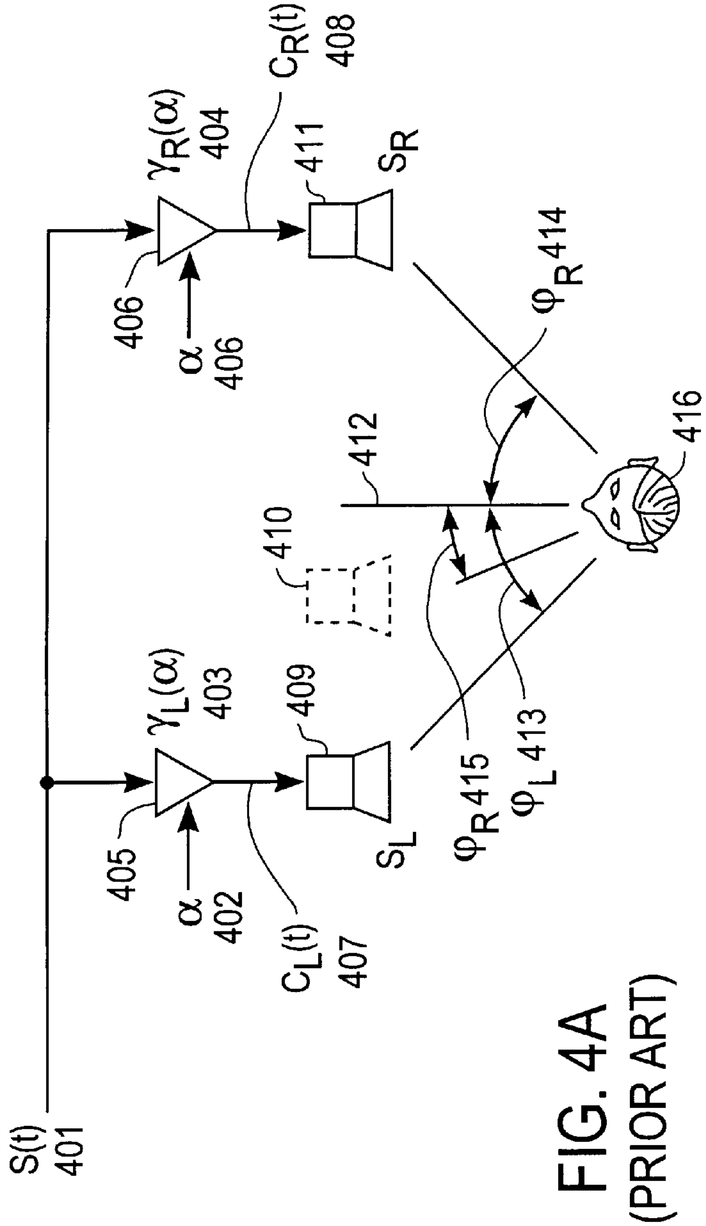
FIG. 4A (PRIOR ART)
FIGS. 4A–4B illustrate a conventional panning technique as applied to stereo signals.
Figure 4B:
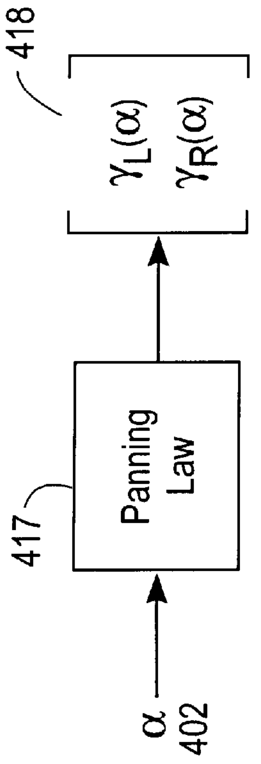
FIG. 4B (PRIOR ART)
Figure 5A:
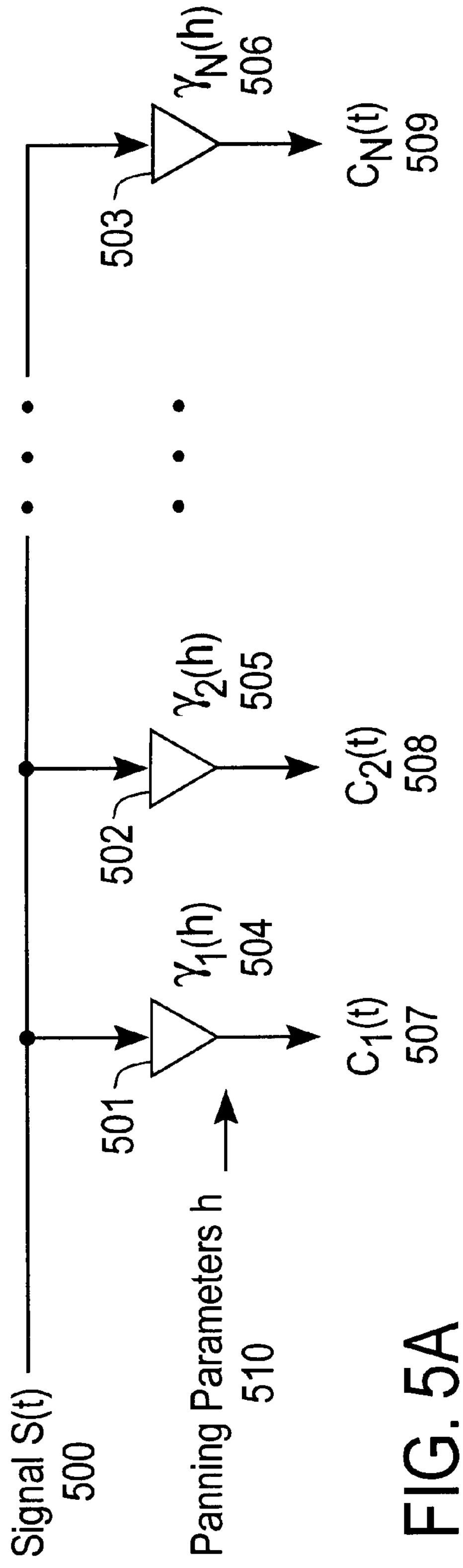
FIG. 5A (PRIOR ART)
FIGS. 5A–5B illustrate another conventional panning technique.
Figure 5B:
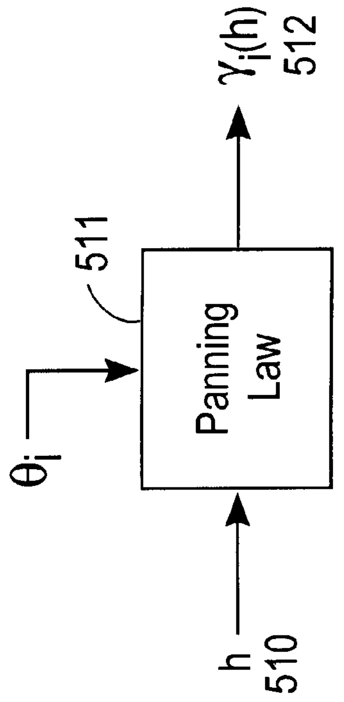
FIG. 5B (PRIOR ART)
Figure 6:
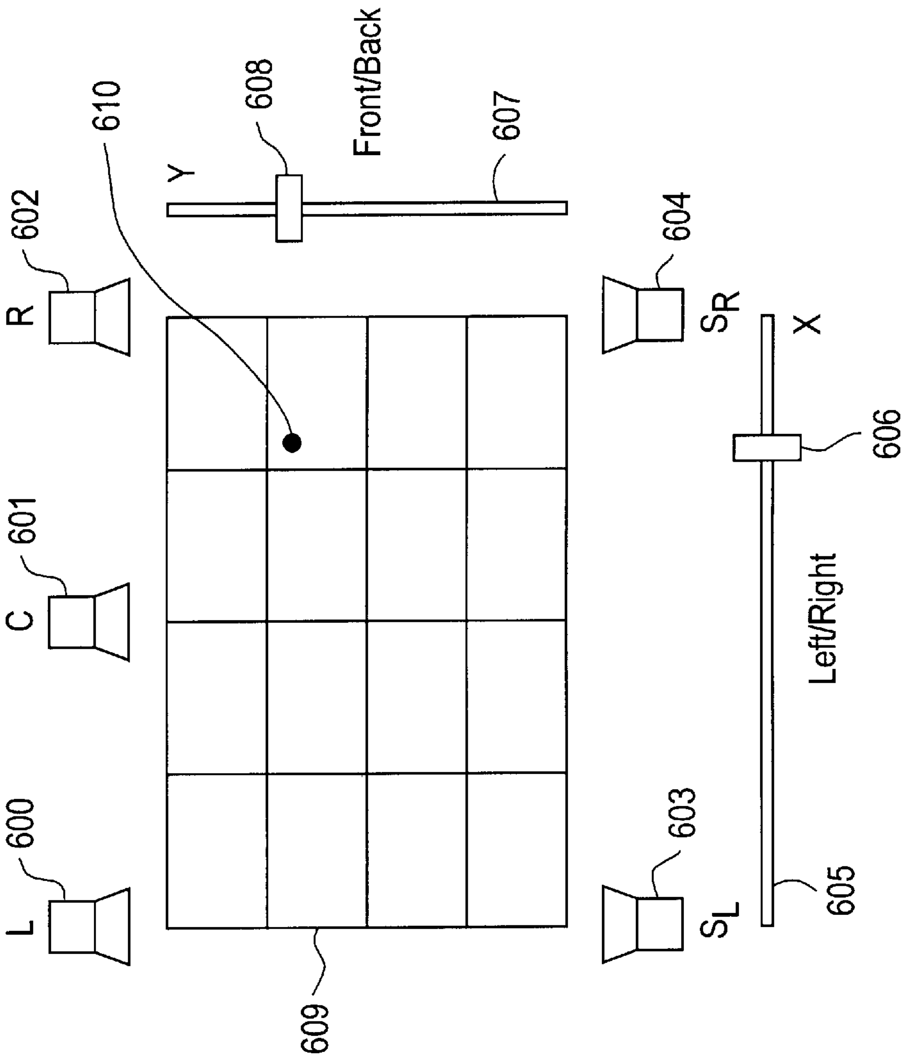
FIG. 6 (PRIOR ART)
FIG. 6 illustrates a conventional surround sound panning technique for controlling front/back and left/right variables.
Figure 7A:
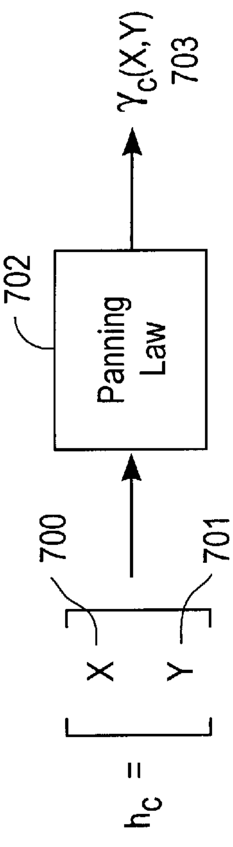
FIG. 7A (PRIOR ART)
FIGS. 7A–7D illustrate surround sound panning techniques as applied to the conventional surround sound format of FIG. 6.
Figure 7B:
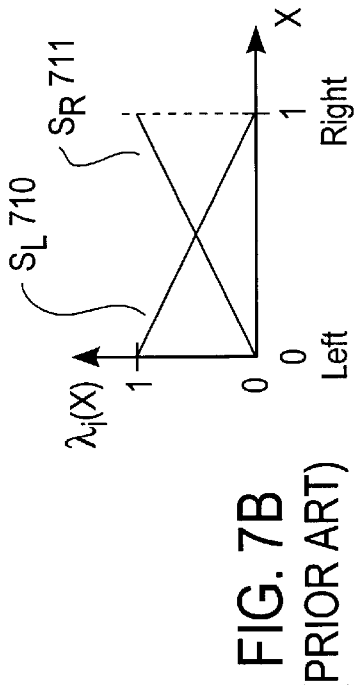
FIG. 7B (PRIOR ART)
Figure 7C:
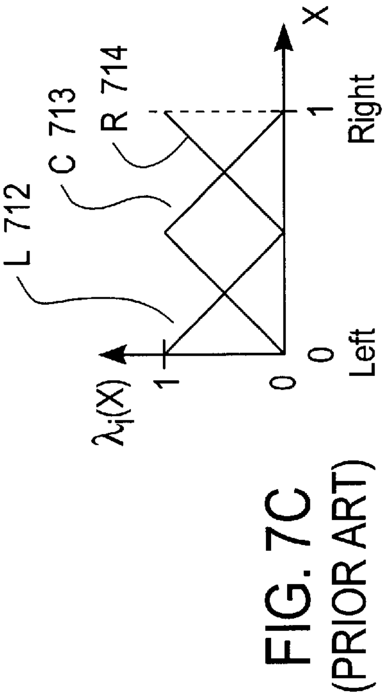
FIG. 7C (PRIOR ART)
Figure 7D:
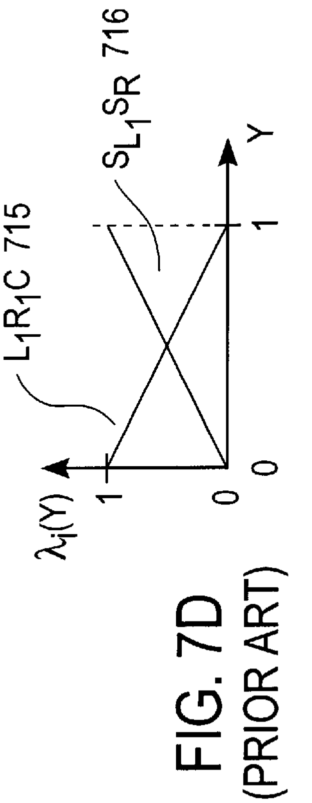
FIG. 7D (PRIOR ART)

Next, FIG. 8B illustrates a graph of $\zeta_i(x)$ with respect to left/right position of the speakers illustrated in FIG. 6. The line 806 representing the x-direction panning law function for the leftmost speakers 600, 603 is a linear slope having a negative value 1 intersecting the horizontal axis at x=1. Conversely, line 807 representing the x-direction panning law function of the two rightmost speakers 602, 604 is a linear slope having a positive value of 1 and intersecting the horizontal axis at x=0. The center front speaker 601 has a slope 808 of zero along the horizontal axis between x=0 and x=1.

Although the present invention has been described in detail with reference to the preferred embodiments thereof, those skilled in the art will appreciate that various substitutions and modifications can be made to the examples described herein while remaining within the spirit and scope of the invention as defined in the appended claims.

What is claimed is:

1. A method for surround sound panning, comprising:

preparing a panning profile having a non-zero spatial extent parameter of a perceived sound, and speaker configuration; and deriving panning weights based on the panning profile and speaker configuration.

2. The method of claim 1, wherein the panning profile specifies panning width.

3. The method of claim 1, further comprising:

receiving a signal; and applying the panning weights to the signal.

4. A method for surround sound panning, comprising:

preparing a surround sound panning profile having a non-zero spatial extent parameter of a perceived sound;

receiving a desired soundfield width; and adjusting the panning profile in accordance with the desired soundfield width.

5. A method according to claim 4, further comprising:

receiving a desired soundfield azimuth; and further adjusting the panning profile in accordance with the desired soundfield azimuth.

6. An apparatus for surround sound panning, comprising:

means for preparing a surround sound panning profile having a non-zero spatial extent parameter of a perceived sound; and means for displaying the surround sound panning profile.

7. An apparatus according to claim 6, further comprising:

means for accepting user adjustments of the surround sound panning profile.

8. An apparatus for surround sound panning, comprising:

means for preparing a surround sound panning profile having a non-zero spatial extent parameter of a perceived sound; and means for displaying a feature of the surround sound panning profile.

9. An apparatus according to claim 8, further comprising:

means for accepting user adjustments of the feature of the surround sound panning profile.

10. A method for determining surround sound panning weights, comprising:

preparing a desired surround sound panning profile having a non-zero spatial extent parameter of a perceived sound, and a speaker configuration.

11. The method of claim 10, further comprising:

preparing a speaker fade function; and integrating a function of the desired surround sound panning profile and the speaker fade function.

12. A method for surround sound panning, comprising:

preparing panning parameters of a surround sound panning profile specified in a cartesian coordinate system, the surround sound panning profile having a non-zero spatial extent parameter of a perceived sound;

translating said panning parameters to a polar coordinate system.

13. A method for surround sound panning, comprising:

preparing panning parameters of a desired surround sound panning profile specified in a polar coordinate system, the surround sound panning profile having a non-zero spatial extent parameter of a perceived sound; and translating said panning parameters to a cartesian coordinate system.

14. A method for surround sound panning, comprising:

preparing front/back and left/right panning parameters; and deriving panning azimuth of a surround sound panning profile using said panning parameters, the surround sound panning profile having a non-zero spatial extent parameter of a perceived sound.

15. A method for surround sound panning, comprising:

preparing front/back and left/right panning parameters; and deriving panning width of a surround sound panning profile using said panning parameters, the surround sound panning profile having a non-zero spatial extent parameter of a perceived sound.

* * * * *